United States Patent
Liu et al.

(10) Patent No.: US 11,824,096 B2
(45) Date of Patent: *Nov. 21, 2023

(54) FIELD-EFFECT TRANSISTORS AND METHODS OF THEIR FORMATION

(71) Applicant: MICRON TECHNOLOGY, INC., Boise, ID (US)

(72) Inventors: Haitao Liu, Boise, ID (US); Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 135 days.

This patent is subject to a terminal disclaimer.

(21) Appl. No.: 17/468,936

(22) Filed: Sep. 8, 2021

(65) Prior Publication Data

US 2021/0408244 A1  Dec. 30, 2021

Related U.S. Application Data

(63) Continuation of application No. 16/685,205, filed on Nov. 15, 2019, now Pat. No. 11,121,223.

(51) Int. Cl.
| | |
|---|---|
| *H01L 21/28* | (2006.01) |
| *H01L 21/763* | (2006.01) |
| *G11C 16/04* | (2006.01) |

(52) U.S. Cl.
CPC .... *H01L 29/40114* (2019.08); *G11C 16/0483* (2013.01); *H01L 21/763* (2013.01); *G11C 16/0458* (2013.01)

(58) Field of Classification Search
None
See application file for complete search history.

(56) References Cited

U.S. PATENT DOCUMENTS

| | | | |
|---|---|---|---|
| 6,455,890 B1 | 9/2002 | Chang et al. | |
| 11,121,223 B2 * | 9/2021 | Liu | ............ H10B 41/27 |
| 2009/0294832 A1 | 12/2009 | Kakoschke et al. | |
| 2015/0311221 A1 | 10/2015 | Huang et al. | |

OTHER PUBLICATIONS

Salm, C., et al., "Diffusion and Electrical Properties of Boron and Arsenic Doped Poly-Si and Poly-GexSi1_x (x 0.3) as Gate Material for Sub-0.25 pm Complementary Metal Oxide," The Electrochemical Society, Inc., J. Electrochem. Soc., vol. 144, No. Oct. 10, 1997.
Carroll, M.S., et al., "Quantitative Measurement of Reduction of Boron Diffusion by Substitutional Carbon Incorporation," Materials Research Society Symposium Z, Proceedings vol. 527, San Francisco, CA, Apr. 13-17, 1998, 6 pp.

* cited by examiner

*Primary Examiner* — Asok K Sarkar
(74) *Attorney, Agent, or Firm* — Dicke, Billig & Czaja, PLLC

(57) ABSTRACT

Field-effect transistors, and methods of forming such field-effect transistors, including a gate dielectric overlying a semiconductor material, and a control gate overlying the gate dielectric, wherein the control gate includes an instance of a first polycrystalline silicon-containing material consisting essentially of polycrystalline silicon, and an instance of a second polycrystalline silicon-containing material selected from a group consisting of polycrystalline silicon-germanium and polycrystalline silicon-germanium-carbon.

25 Claims, 13 Drawing Sheets

FIELD-EFFECT TRANSISTORS AND METHODS OF THEIR FORMATION

RELATED APPLICATION

This Application is a Continuation of U.S. application Ser. No. 16/685,205, titled "CONTROL GATE STRUCTURES FOR FIELD-EFFECT TRANSISTORS," filed Nov. 15, 2019, issued as U.S. Pat. No. 11,121,223 on Sep. 14, 2021, which is commonly assigned and incorporated herein by reference.

TECHNICAL FIELD

The present disclosure relates generally to integrated circuits, and, in particular, in one or more embodiments, the present disclosure relates to control gate structures for field-effect transistors.

BACKGROUND

Integrated circuit devices traverse a broad range of electronic devices. One particular type include memory devices, oftentimes referred to simply as memory. Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor might be connected to a source, while each drain select transistor might be connected to a data line, such as column bit line. Variations using more than one select gate between a string of memory cells and the source, and/or between the string of memory cells and the data line, are known.

Field-effect transistors of integrated circuit devices are often formed of multiple layers of different materials, e.g., a dielectric, semiconductor and/or conductive materials. These transistors often utilize a dopant impurity to impart conductivity to a semiconductor material for use in a control gate of the transistor. As feature sizes and layer thicknesses are reduced, control of diffusion of the dopant impurity may become more critical.

DETAILED DESCRIPTION

Figure 1:
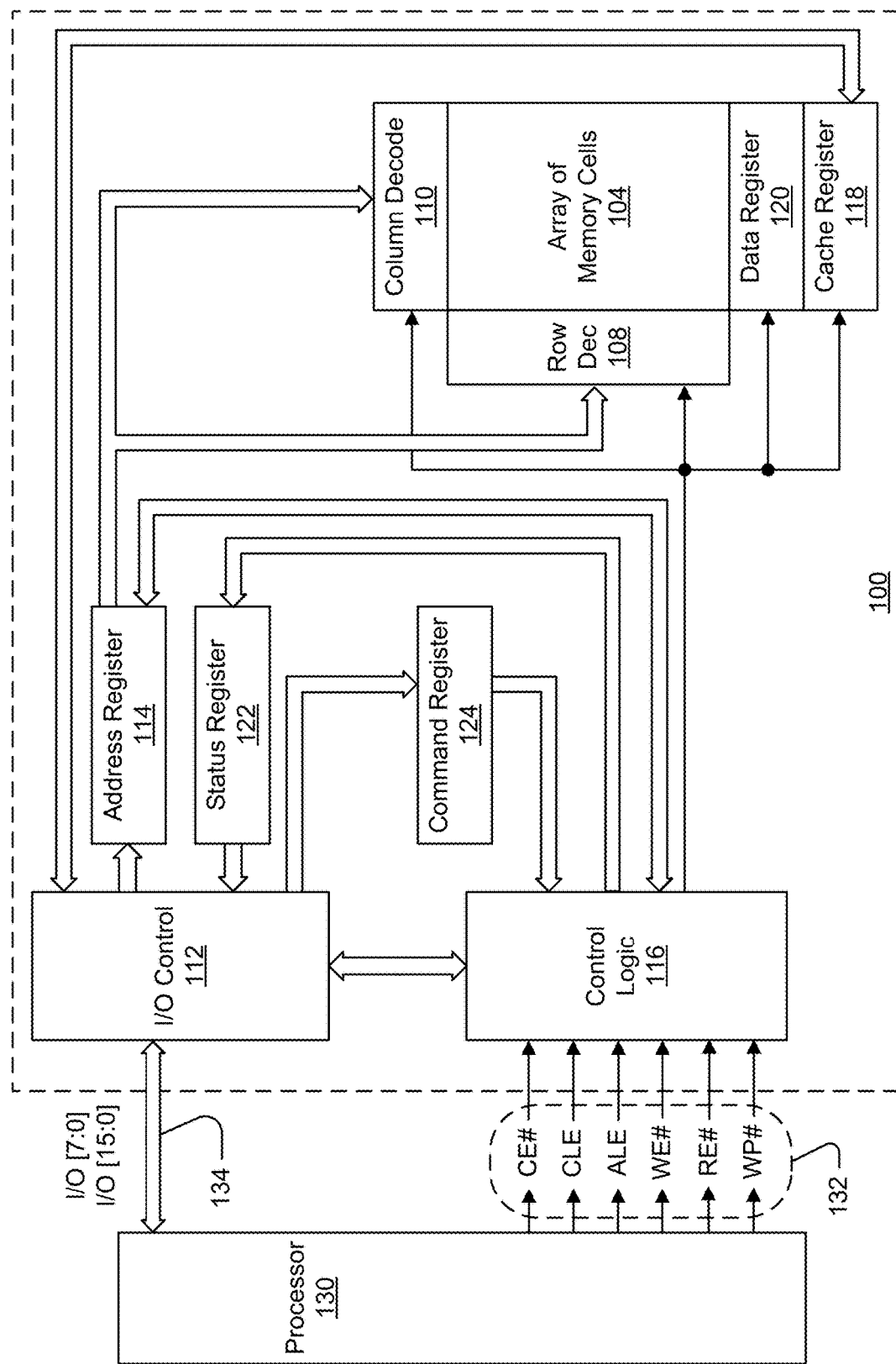
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and generates status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130. The I/O control circuitry 112, and/or other circuitry of the memory 100, might include transistors (not shown in FIG. 1) having a structure in accordance with one or more embodiments.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive node providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
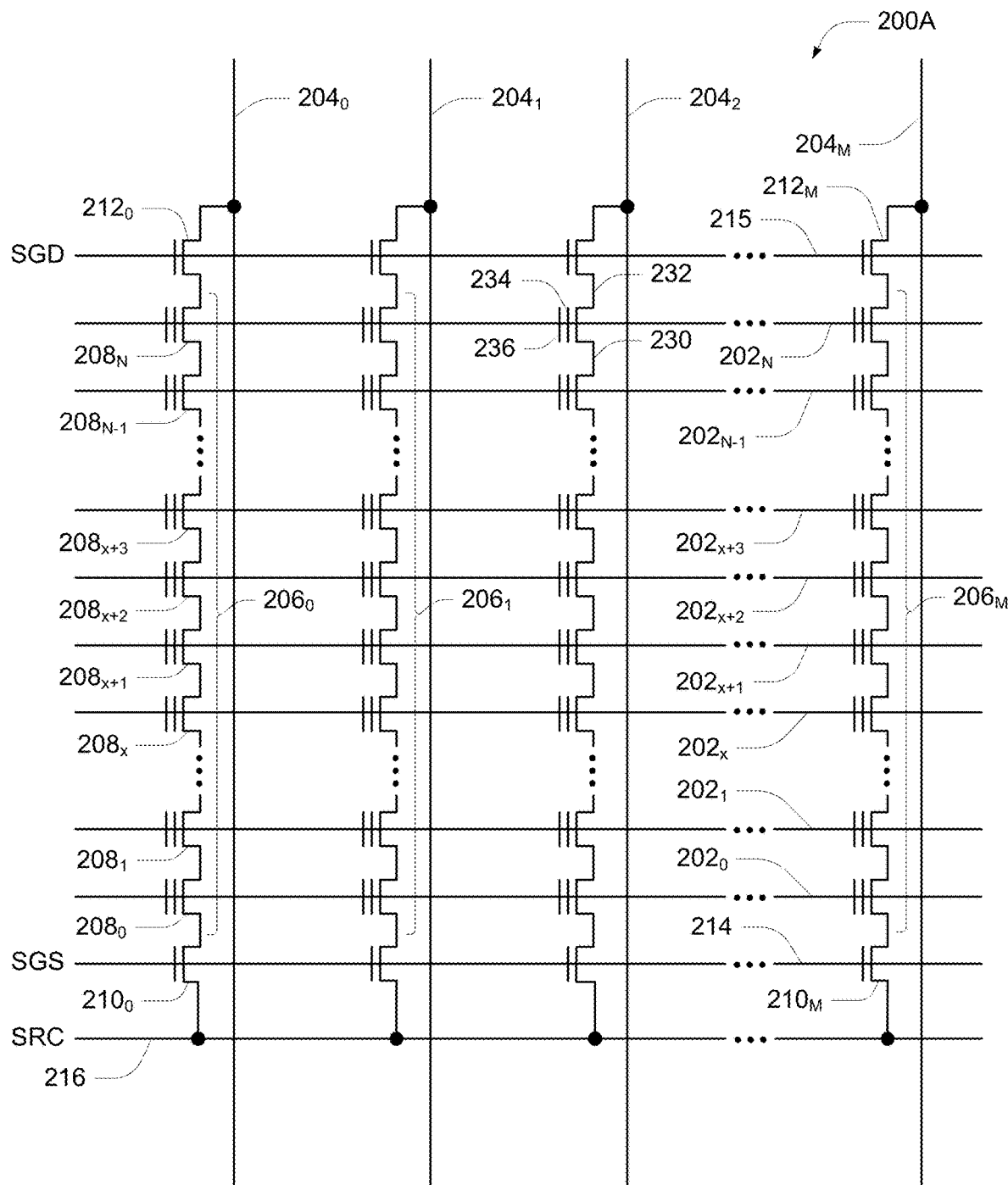
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 might represent non-volatile memory cells for storage of data. The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the bit lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) a word line 202.

A column of the memory cells 208 might be a NAND string 206 or a plurality of NAND strings 206 selectively connected to a given bit line 204. A row of the memory cells 208 might be memory cells 208 commonly connected to a given word line 202. A row of memory cells 208 can, but need not, include all memory cells 208 commonly connected to a given word line 202. Rows of memory cells 208 might often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) might be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) might be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A might be numbered consecutively from bit line $204_0$ to bit line $204_M$. Other groupings of memory cells 208 commonly connected to a given word line 202 might also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
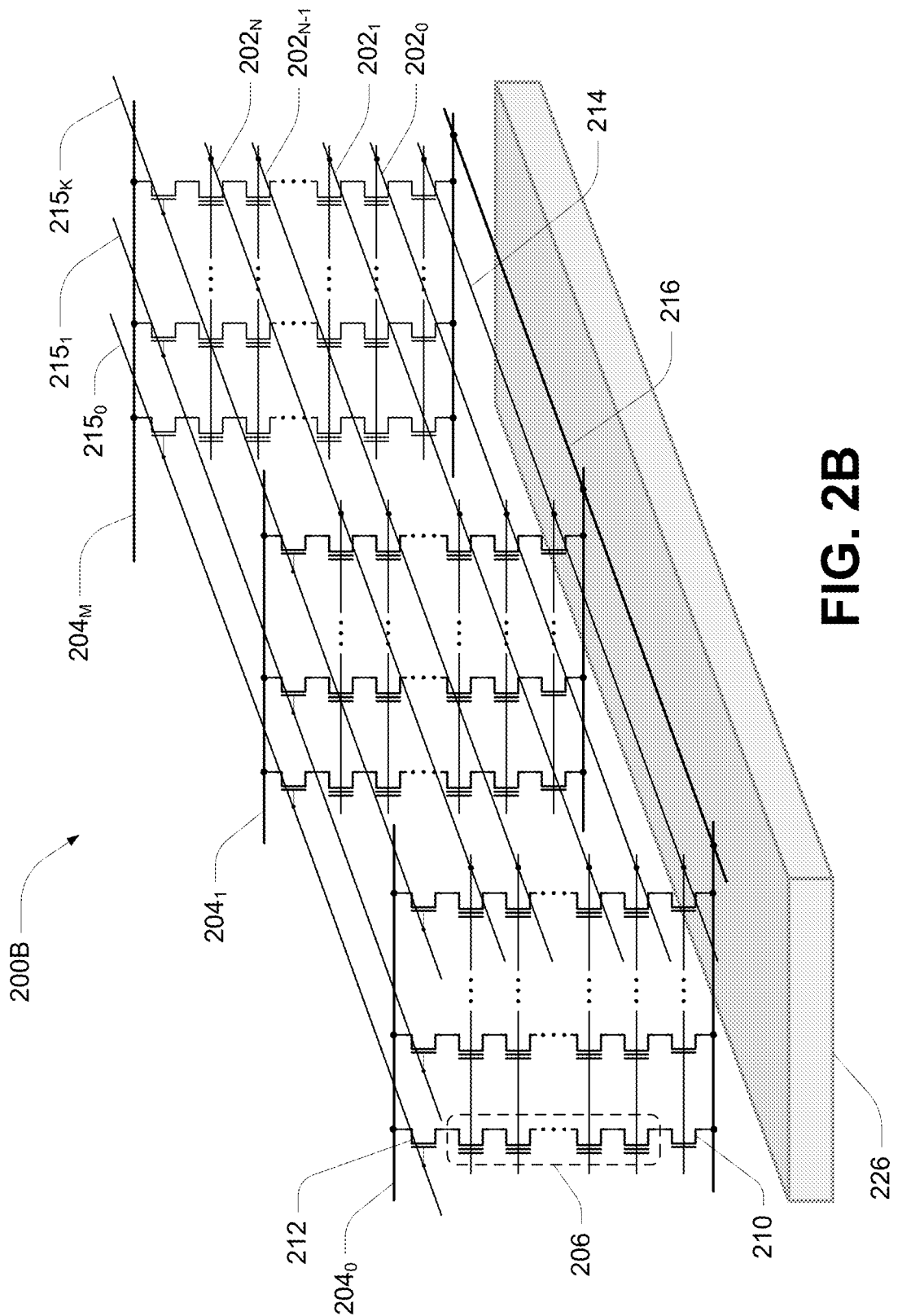

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars where a portion of a pillar might act as a channel region of the memory cells of NAND strings 206. The NAND strings 206 might be each selectively connected to a bit line $204_0$-$204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 might be connected to multiple rows of memory cells of the memory array 200B. Rows of memory cells that are commonly connected to each other by a particular word line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
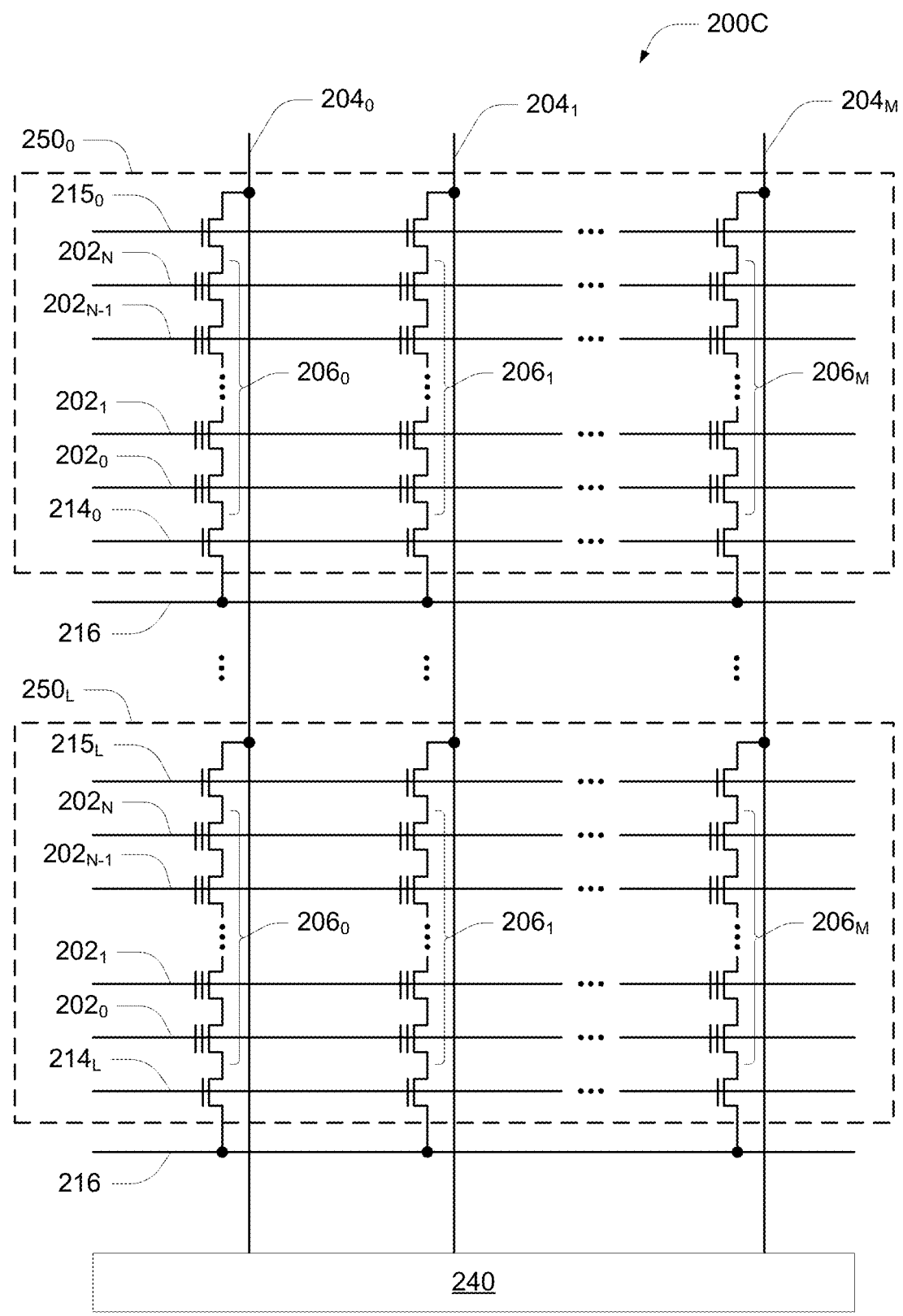

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C might include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A might be a portion of the array of memory cells 200C, for example. FIG. 2C depicts groupings of NAND strings 206 into blocks of memory cells 250, e.g., blocks of memory cells $250_0$-$250_L$. Blocks of memory cells 250 might be groupings of memory cells 208 that might be erased together in a single erase operation, sometimes referred to as erase blocks. Each block of memory cells 250 might represent those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 215 of one block of memory cells 250 might have no direct connection to access lines 202 and select lines 214 and 215, respectively, of any other block of memory cells of the blocks of memory cells $250_0$-$250_L$.

The data lines $204_0$-$204_M$ might be connected (e.g., selectively connected) to a buffer portion 240, which might be a portion of a data buffer of the memory. The buffer portion 240 might correspond to a memory plane (e.g., the set of blocks of memory cells $250_0$-$250_L$). The buffer portion 240 might include sense circuits (not shown in FIG. 2C) for sensing data values indicated on respective data lines 204.

Figure 3A:
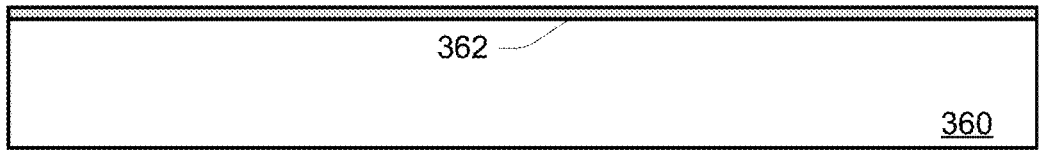
FIGS. 3A-3J are cross-sectional views of a field-effect transistor in accordance with an embodiment at various stages of fabrication.

FIGS. 3A-3J are cross-sectional views of a field-effect transistor in accordance with an embodiment at various stages of fabrication. In FIG. 3A, a dielectric 362 might be formed overlying (e.g., on) a semiconductor 360. The semiconductor 360 might contain monocrystalline silicon or other semiconductor material. The semiconductor 360 might have a conductivity type, e.g., a p-type conductivity. The dielectric 362 might generally be formed of one or more dielectric materials. For example, the dielectric 362 might comprise, consist of, or consist essentially of an oxide, e.g., silicon dioxide ($SiO_2$), and/or may comprise, consist of, or consist essentially of a high-K dielectric material, such as aluminum oxides ($AlO_x$), hafnium oxides ($HfO_x$), hafnium aluminum oxides ($HfAlO_x$), hafnium silicon oxides ($HfSiO_x$), lanthanum oxides ($LaO_x$), tantalum oxides ($TaO_x$), zirconium oxides ($ZrO_x$), zirconium aluminum oxides ($ZrAlO_x$), yttrium oxide ($Y_2O_3$), etc., as well as any other dielectric material. As one example, the dielectric 362 might be a thermal oxide formed by reaction of an underlying silicon-containing semiconductor 360 with oxygen, which might include an atmosphere containing $O_2$ or $O_3$, for example. The dielectric 362 might correspond to a gate dielectric of a future transistor.

Figure 3B:
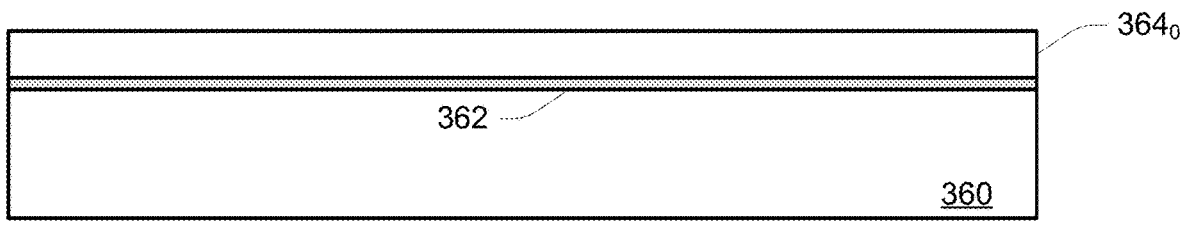

In FIG. 3B, a first instance of a first polycrystalline silicon-containing material $364_0$ might be formed overlying (e.g., on) the dielectric 362. The first polycrystalline silicon-containing material might contain polycrystalline silicon, commonly referred to as polysilicon. The first polycrystalline silicon-containing material might further consist essentially of polysilicon. In this regard, the first polycrystalline silicon-containing material could contain trace amounts of elements other than silicon, or less than 0.1 atomic percent (<0.1 at %) of each such trace element, with a total concentration of such trace elements less than 1 at %. The first polycrystalline silicon-containing material might be formed, for example, using chemical vapor deposition (CVD), low-pressure CVD (LPCVD), physical vapor deposition (PVD) or atomic layer deposition (ALD). Polycrystalline materials generally contain many grains of material having a crystalline structure, e.g., crystalline grains, where the individual grains might be randomly oriented with respect to each other.

Figure 3C:
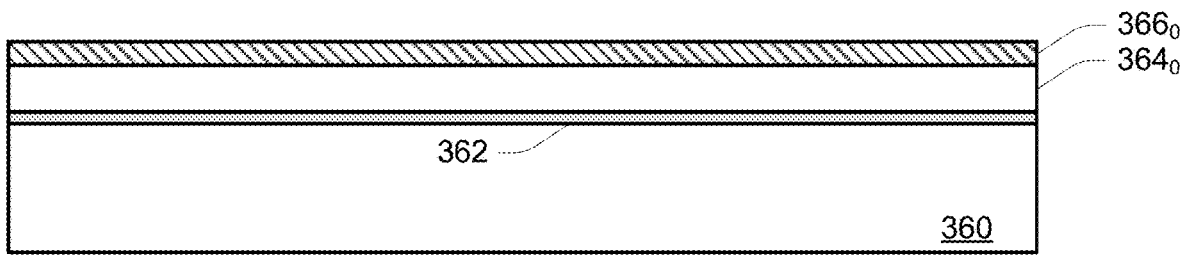

In FIG. 3C, a first instance of a second polycrystalline silicon-containing material $366_0$ might be formed overlying (e.g., on) the first instance of the first polycrystalline silicon-containing material $364_0$. The first instance of the second polycrystalline silicon-containing material $366_0$ might be immediately adjacent (e.g., in contact with) the first instance of the first polycrystalline silicon-containing material $364_0$. The second polycrystalline silicon-containing material might contain polycrystalline silicon-germanium or polycrystalline silicon-germanium-carbon. The crystalline grains of the second polycrystalline silicon-containing material might generally be represented by the chemical formula $Si_XGe_YC_Z$, where X+Y+Z=1, 0.05<=Y<=0.30, and 0<=Z<=0.10. The second polycrystalline silicon-containing material might further consist essentially of polycrystalline silicon-germanium or polycrystalline silicon-germanium-carbon. In this regard, the second polycrystalline silicon-containing material could contain trace amounts of elements other than silicon, germanium and carbon, or less than 0.1 atomic percent (<0.1 at %) of each such element, with a total concentration of such trace elements less than 1 at %. The second polycrystalline silicon-containing material might be formed, for example, using chemical vapor deposition (CVD), low-pressure CVD (LPCVD), physical vapor deposition (PVD) or atomic layer deposition (ALD). Grains of the second polycrystalline silicon-containing material might have a same crystalline structure, e.g., a diamond lattice structure, as grains of the first polycrystalline silicon-containing material.

Figure 3D:
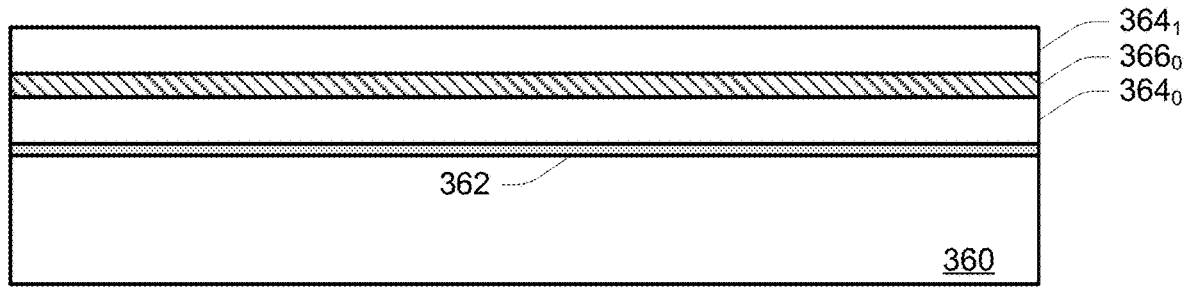
Figure 3E:
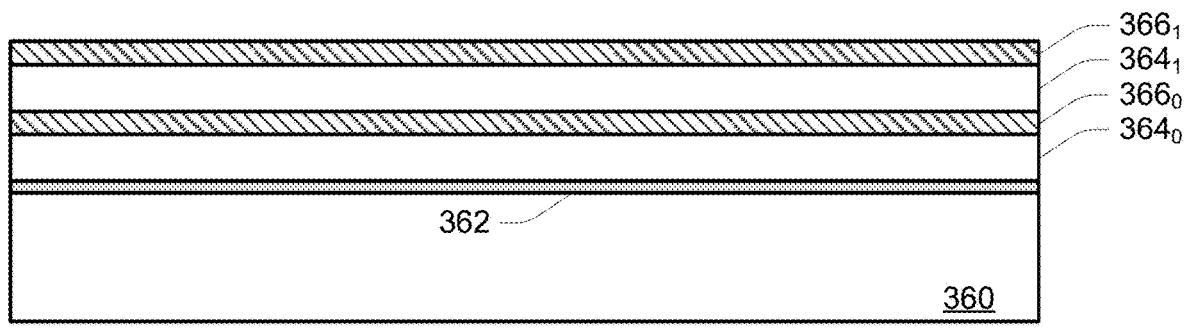
Figure 3F:
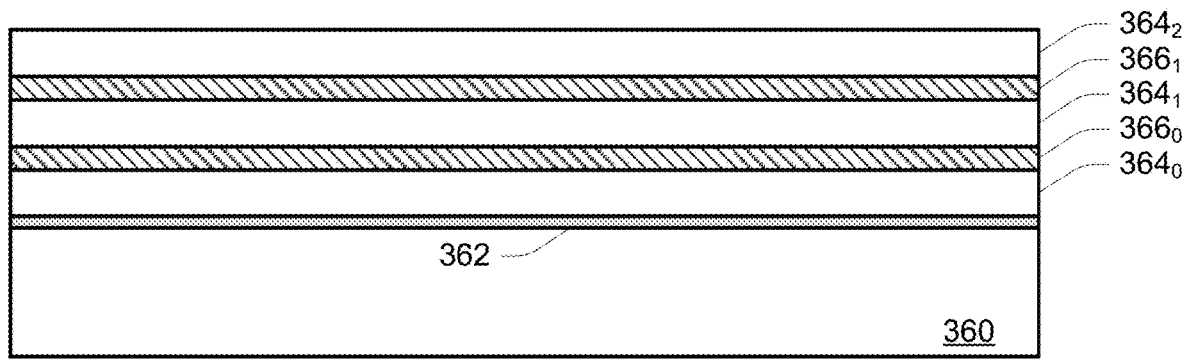

In FIG. 3D, a second instance of the first polycrystalline silicon-containing material $364_1$ might be formed overlying (e.g., on) the first instance of the second polycrystalline silicon-containing material $366_0$. The second instance of the first polycrystalline silicon-containing material $364_1$ might be immediately adjacent (e.g., in contact with) the first instance of the second polycrystalline silicon-containing material $366_0$. In FIG. 3E, a second instance of the second polycrystalline silicon-containing material $366_1$ might be formed overlying (e.g., on) the second instance of the first polycrystalline silicon-containing material $364_1$. The second instance of the second polycrystalline silicon-containing material $366_1$ might be immediately adjacent (e.g., in contact with) the second instance of the first polycrystalline silicon-containing material $364_1$. In FIG. 3F, a third instance of the first polycrystalline silicon-containing material $364_2$ might be formed overlying (e.g., on) the second instance of the second polycrystalline silicon-containing material $366_1$. The third instance of the first polycrystalline silicon-containing material $364_2$ might be immediately adjacent (e.g., in contact with) the second instance of the second polycrystalline silicon-containing material $366_1$. The alternating instances of the first polycrystalline silicon-containing material and the second polycrystalline silicon-containing material might collectively be referred to as a control gate structure of a future transistor.

Figure 3G:
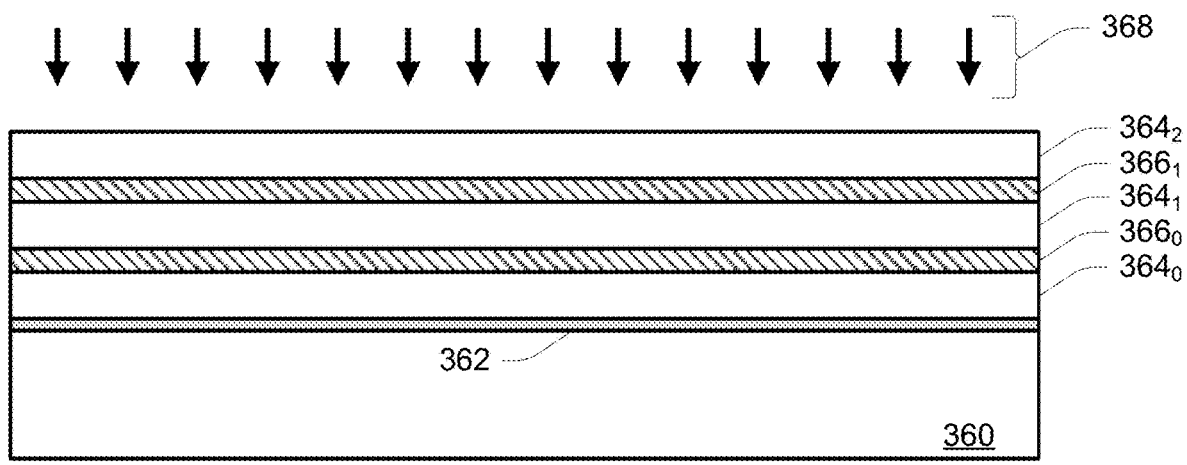

In FIG. 3G, the control gate structure might be conductively doped with boron or other dopant impurity. For purposes herein, a dopant impurity is an ion, element or molecule, or some combination of ions, elements and/or molecules, added to the control gate structure to impart bulk conductivity to instances of the first and second polycrystalline silicon-containing materials. Such doping might involve the acceleration of boron ions, as depicted conceptually by arrows 368, from the dissociation of boron-containing molecules, e.g., $BF_2$, $BF_3$ $B_2H_6$. Examples of such doping processes might include plasma doping (PLAD) and/or beam-line implantation. An anneal process might be used to diffuse the implanted boron within the control gate structure. In prior art control gate structures formed only of polysilicon, diffusion of the boron as a result of this anneal, as well as additional diffusion resulting from the thermal budget from subsequent processing for other circuit components, might extend into and/or through the dielectric 362. In contrast, the instances of the second polycrystalline silicon-containing material further containing germanium, or germanium and carbon, might facilitate a reduction in diffusion of the boron into and/or through the dielectric 362 in comparison to a control gate structure formed only of polysilicon. Penetration of the boron through the dielectric 362, and thus into the channel region of the transistor, is believed to be a significant limitation to the scaling of low-voltage transistors due to the generally thin gate dielectrics, which might be 25 Å or less.

Figure 3H:
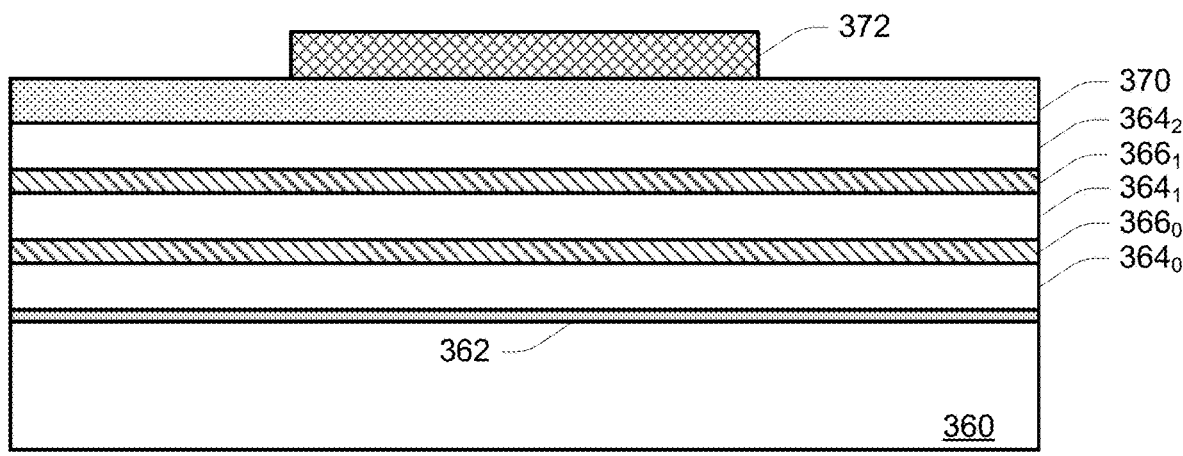

In FIG. 3H, a dielectric cap 370 might be formed overlying (e.g., on) the third instance of the first polycrystalline silicon-containing material $364_2$. The dielectric cap 370 might generally be formed of one or more dielectric materials. As one example, the dielectric cap 370 might be silicon nitride (SiN). A patterned mask 372 might be formed overlying (e.g., on) the dielectric cap 370. The patterned mask 372 might define portions of the dielectric cap 370, the instances of the first and second polycrystalline silicon-containing materials 364 and 366, and the dielectric 362, to be removed to define a gate stack of the future transistor.

Photolithographic processes are often used to define a desired pattern in integrated circuit fabrication. In a photolithographic process, a photoresist layer may be formed on the surface of the in-process device. The photoresist layer may contain a photo-sensitive polymer whose ease of removal is altered upon exposure to light or other electromagnetic radiation. To define the pattern, the photoresist layer may be selectively exposed to radiation and then developed to expose portions of the underlying layer. In a positive resist system, the portions of the photoresist layer exposed to the radiation are photosolubilized and a photolithographic mask is designed to block the radiation from those portions of the photoresist layer that are to remain after developing to define a patterned mask. In a negative resist systems, the portions of the photoresist layer exposed to the radiation are photopolymerized and the photolithographic mask is designed to block the radiation from those portions of the photoresist layer that are to be removed after developing to define a patterned mask.

Figure 3I:
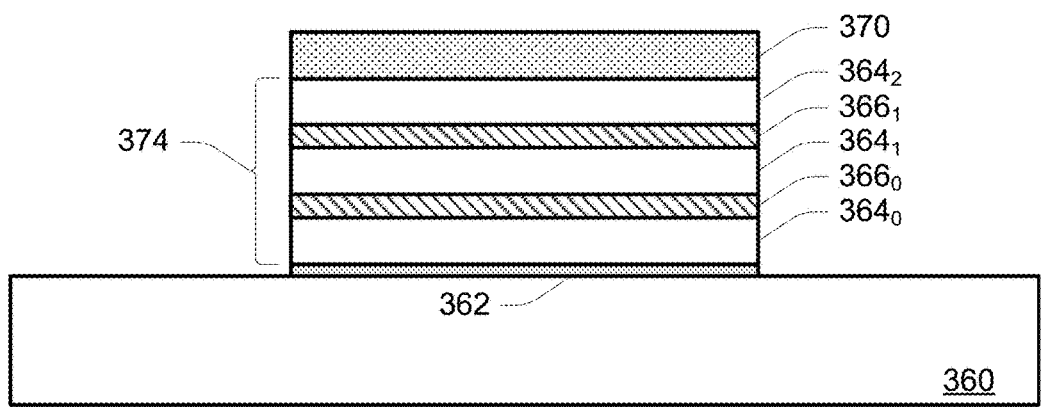
Figure 3J:
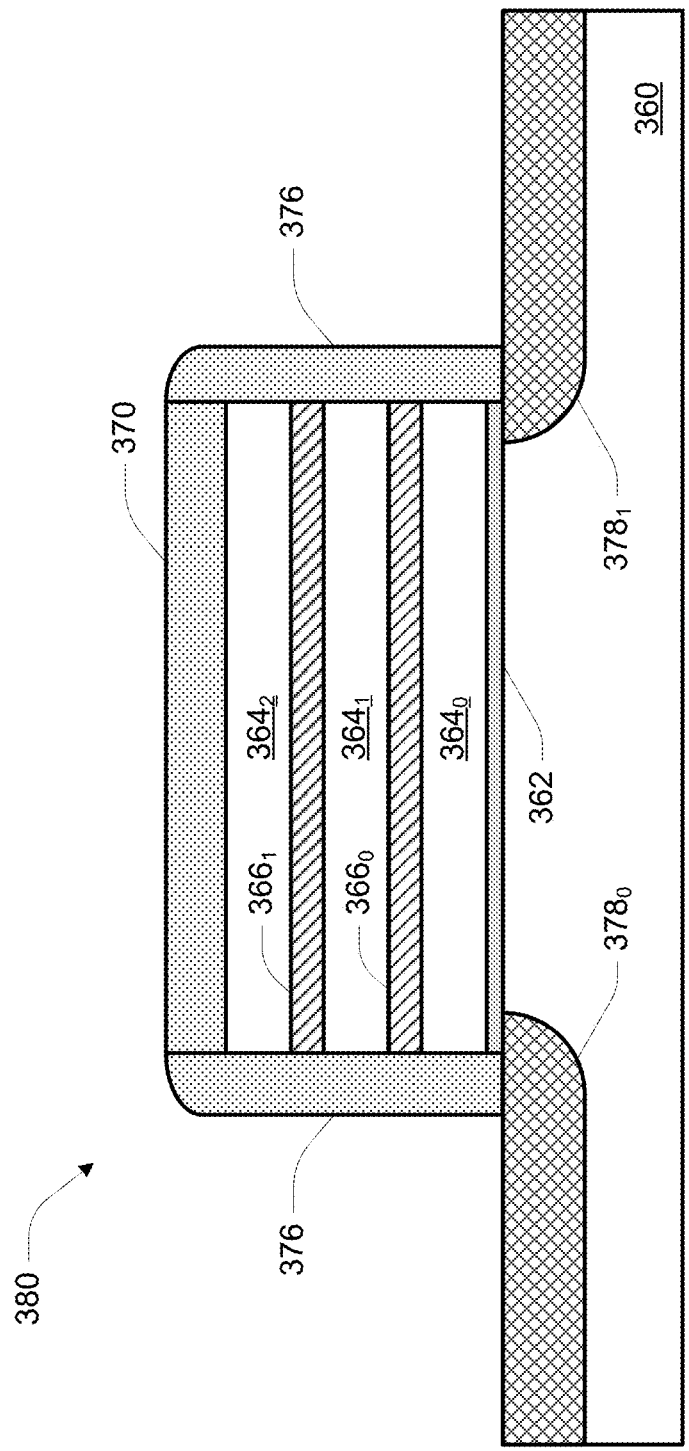

In FIG. 3I, exposed portions of the dielectric cap 370, the instances of the first and second polycrystalline silicon-containing materials 364 and 366, and the dielectric 362 are removed, which might define a control gate 374 of the future transistor. In FIG. 3J, dielectric spacers 376 might be formed on sidewalls of the control gate 374, and source/drain regions $378_0$ and $378_1$ might be formed in the semiconductor 360, to define the transistor 380. The dielectric spacers 376 might generally be formed of one or more dielectric materials. As one example, the dielectric spacers 376 might be silicon nitride (SiN). For an n-type field-effect transistor (nFET), the source/drain regions 378 might have an n-type conductivity while the semiconductor 360 might have a p-type conductivity. For a p-type field-effect transistor (pFET), the source/drain regions 378 and the semiconductor 360 might each have a p-type conductivity. In general, for an enhancement mode device, the source/drain regions 378 and the semiconductor 360 might have different, e.g., opposite, conductivity types, while for a depletion mode device, the source/drain regions 378 and the semiconductor 360 might have a same conductivity type.

The example of FIG. 3J depicted three instances of the first polycrystalline silicon-containing material 364 alternating with two instances of the second polycrystalline silicon-containing material 366. However, embodiments might use differing numbers of alternating instances of the first polycrystalline silicon-containing material 340 and the second polycrystalline silicon-containing material 366. In general, the number (S) of instances of the second polycrystalline silicon-containing material 366 might be a function of the number (F) of instances of the first polycrystalline silicon-containing material 364 defined by the following equation:

$$(F-1) \leq S \leq (F+1), \text{ where } F \geq 1 \text{ and } S \geq 1 \qquad \text{Eq. 1}$$

Figure 4A:
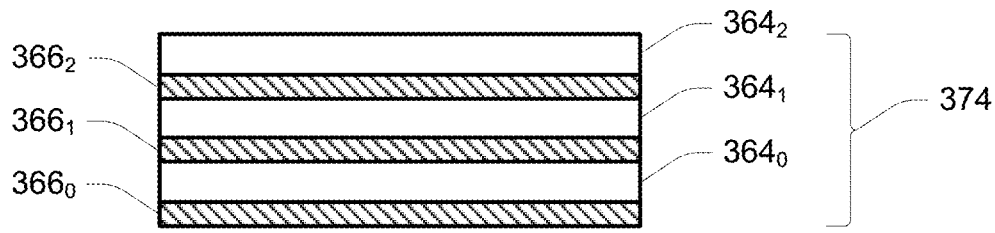
FIGS. 4A-4C are cross-sectional views depicting control gate structures in accordance with other embodiments.
Figure 4B:
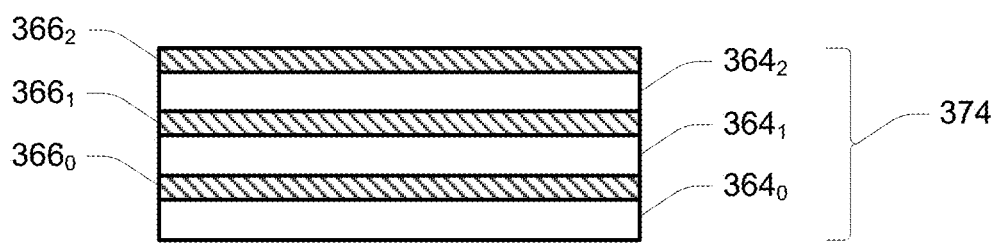
Figure 4C:
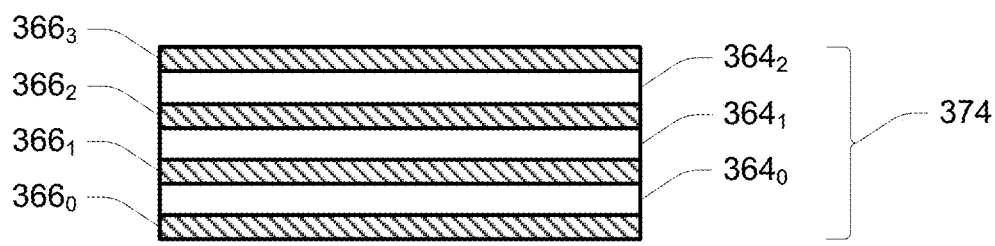

In addition, while the example of FIG. 3J depicted a respective instance of the first polycrystalline silicon-containing material 364 as both a top and bottom instance of the control gate 374, an instance of the second polycrystalline silicon-containing material 366 might alternatively form a top and/or bottom instance of the control gate 374. FIGS. 4A-4C are cross-sectional views depicting control gate structures in accordance with other embodiments.

In FIG. 4A, the control gate 374 includes three instances of the first polycrystalline silicon-containing material 364, e.g., $364_0$-$364_2$, and three (e.g., S=F) instances of the second polycrystalline silicon-containing material 366, e.g., $366_0$-$366_2$, with the instance of the first polycrystalline silicon-containing material $364_2$ as the top instance of the control gate 374 and the instance of the second polycrystalline silicon-containing material $366_0$ as the bottom instance of the control gate 374. In FIG. 4B, the control gate 374 includes three instances of the first polycrystalline silicon-containing material 364, e.g., $364_0$-$364_2$, and three (e.g., S=F) instances of the second polycrystalline silicon-containing material 366, e.g., $366_0$-$366_2$, with the instance of the second polycrystalline silicon-containing material $366_2$ as the top instance of the control gate 374 and the instance of the first polycrystalline silicon-containing material $364_0$ as the bottom instance of the control gate 374. In FIG. 4C, the control gate 374 includes three instances of the first polycrystalline silicon-containing material 364, e.g., $364_0$-$364_2$, and four (S=F+1) instances of the second polycrystalline silicon-containing material 366, e.g., $366_0$-$366_3$, with the instance of the second polycrystalline silicon-containing material $366_3$ as the top instance of the control gate 374 and the instance of the second polycrystalline silicon-containing material $366_0$ as the bottom instance of the control gate 374.

A thickness of an instance of the first polycrystalline silicon-containing material 364 or an instance of the second polycrystalline silicon-containing material 366 might be measured in a direction orthogonal to a surface of the semiconductor 360 over which the dielectric 362 is formed, e.g., in a vertical direction of the FIGS. 4A-4C. A thickness of an individual instance of the first polycrystalline silicon-containing material 364 might be, for example, within a range of 1 nm to 20 nm. A thickness of an individual instance of the second polycrystalline silicon-containing material 366 might be, for example, within a range of 1 nm to 20 nm.

A thickness of one instance of the first polycrystalline silicon-containing material 364 might be the same as, or different than, a thickness of a different instance of the first polycrystalline silicon-containing material 364. A thickness of one instance of the second polycrystalline silicon-containing material 366 might be the same as, or different than, a thickness of a different instance of the second polycrystalline silicon-containing material 366. In addition, a thickness of an instance of the first polycrystalline silicon-containing material 364 might be independent of a thickness of an instance of the second polycrystalline silicon-containing material 366.

As the instances of the second polycrystalline silicon-containing material serve to mitigate dopant diffusion relative to the instances of the first polycrystalline silicon-containing material, the number of instances of the second polycrystalline silicon-containing material might be less than the number of instances of the first polycrystalline silicon-containing material. Similarly, the thickness of each instance of the second polycrystalline silicon-containing material might be less than the thickness of one or more instances of the first polycrystalline silicon-containing material, which might include all instances of the first polycrystalline silicon-containing material. For some embodiments, the thickness of an instance of the second polycrystalline silicon-containing material might be less than 50% of the thickness of an adjacent instance of the first polycrystalline silicon-containing material. For some embodiments, the thickness of each instance of the second polycrystalline silicon-containing material might be less than 50% of the thickness of each instance of the first polycrystalline silicon-containing material. For some embodiments, the total thickness of the instances of the second polycrystalline silicon-containing material might be less than 25% of the total thickness of the instances of the first polycrystalline silicon-containing material.

In addition, as PLAD processes might result in a concentration of the dopant near an upper surface of the control gate, it might be desirable to provide for higher rates of diffusion near the top of the control gate structure, and lower rates of diffusion near the bottom of the control gate structure. Accordingly, a thickness of an instance of the second polycrystalline silicon-containing material near the top of the control gate structure (e.g., a portion of the control gate structure away from the gate dielectric) might be less than a thickness of an instance of the second polycrystalline silicon-containing material near the bottom of the control gate structure (e.g., a portion of the control gate structure adjacent the gate dielectric). For some embodiments, a particular instance of the second polycrystalline silicon-containing material might have a thickness greater than a thickness of any instance of the second polycrystalline silicon-containing material farther from the gate dielectric than the particular instance of the second polycrystalline silicon-containing material. The particular instance of the second polycrystalline silicon-containing material might further be less than a thickness of any instance of the second polycrystalline silicon-containing material nearer to the gate dielectric than the particular instance of the second polycrystalline silicon-containing material.

Furthermore, in the chemical formula $Si_XGe_YC_Z$, values of Y and/or Z for crystalline grains of a particular instance of the second polycrystalline silicon-containing material might be different than values of Y and/or Z for crystalline grains of a different instance of the second polycrystalline silicon-containing material. For example, the particular instance of the second polycrystalline silicon-containing material might have higher values of Y and/or Z than the different instance of the second polycrystalline silicon-containing material, while still satisfying the chemical formula $Si_XGe_YC_Z$ with X+Y+Z=1, 0.05<=Y<=0.30, and 0<=Z<=0.10, for both instances of the second polycrystalline silicon-containing material.

Transistors of the type described might be particularly advantageous in applications of a data path of an integrated circuit device, e.g., a data path of a memory. The data path of an integrated circuit might typically utilize low-voltage transistors having generally thin gate dielectrics to facilitate high rates of data transfer at low power. Furthermore, where elements of the data path are formed under an array of memory cells, e.g., as part of the peripheral circuitry 226 or peripheral circuity of other types of memory, they might be expected to be subjected to relatively high levels of thermal budget as a result of the subsequent formation of the array structure. By utilizing control gate structures in accordance with embodiments, diffusion of control gate doping impurities, e.g., boron or other dopant impurity, might be mitigated relative to prior art structures, which could facilitate lower levels of device failures.

Figure 5:
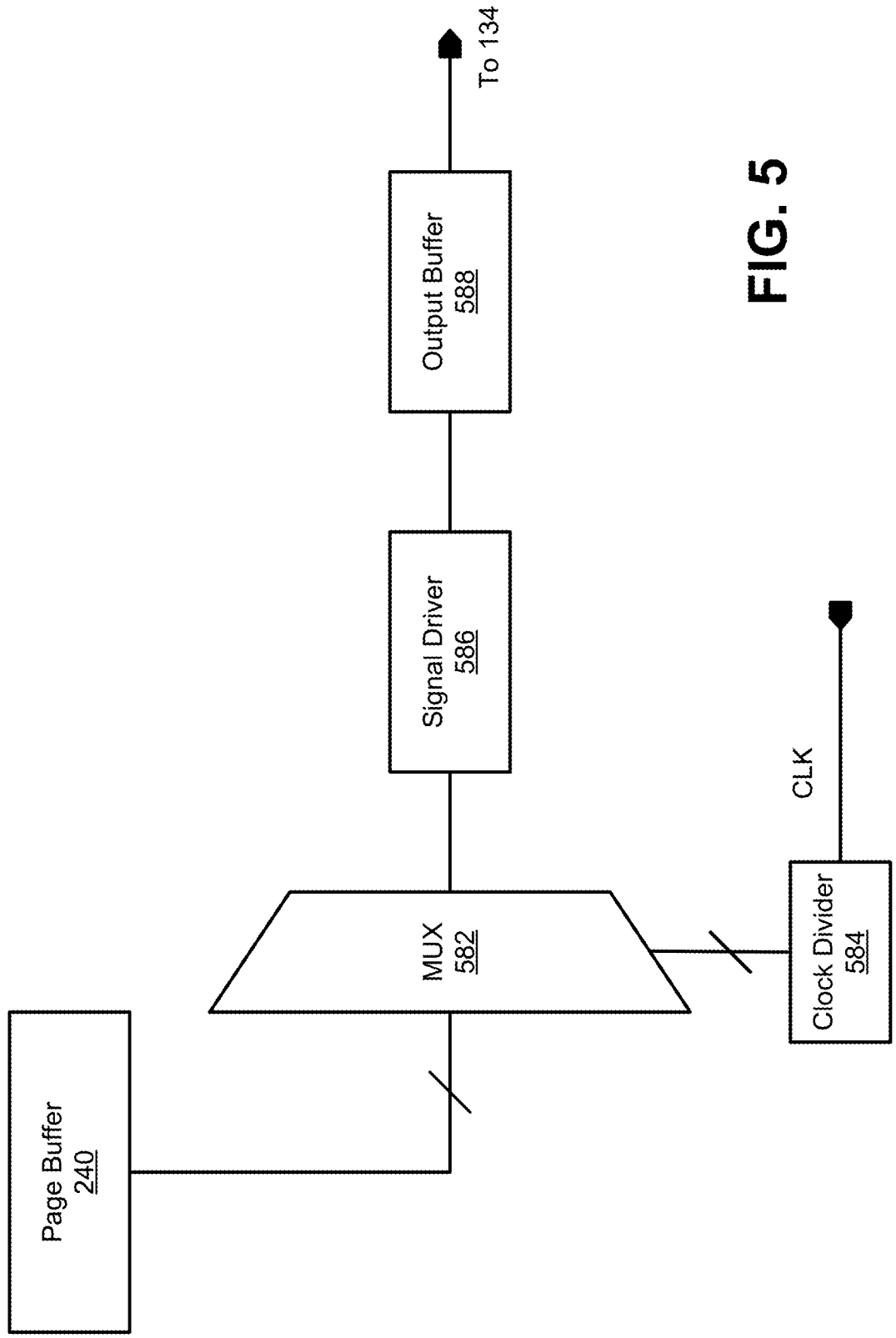
FIG. 5 is a block schematic depicting a data path in accordance with an embodiment.

FIG. 5 is a block schematic depicting a data path in accordance with an embodiment. A data path is generally a series of circuit elements providing data for output from an integrated circuit device, e.g., as read from an array of memory cells, and/or receiving data for input from an external device, e.g., for writing to the array of memory cells. FIG. 5 depicts an example of a data path providing data for output from a page buffer of a memory. However, the concepts may be applicable to data paths of other integrated circuit devices, as well as data paths for receipt of input data.

In FIG. 5, a multiplexer (MUX) 582 might be configured to receive data from a page buffer 240 of a memory, and to provide output to a signal driver 586 in a many to one relationship. In particular, the multiplexer 582 might receive Q inputs from the page buffer 240, that might correspond to a particular digit position of Q different bytes of data, and might provide a selected one of those Q inputs to the signal driver 586. The multiplexer 582 might be responsive to a clock divider 584. The clock divider 584 might receive a clock signal CLK. The clock signal CLK might represent the read enable signal (RE #) received from an external device, e.g., processor 130, or a copy of the read enable signal. The clock divider 584 might be configured to provide Q clock signals to the multiplexer 582. The Q clock signals might each have a duty cycle of 2/Q. The Q clock signals might each have a frequency of 2/Q times the frequency of the clock signal CLK. The Q clock signals might further be shifted in phase from one another by 360/Q degrees. For example, where Q equals 8, the clock divider 584 might generate 8 output clock signals, where each of these output clock signals has a duty cycle of 2/8 or 25%, where each of these output clock signals has a frequency of 2/8 or 1/4 of the frequency of the clock signal CLK, and wherein each of these output clock signals are shifted in phase from one another by 360/8 or 45 degrees (e.g., phases of 0, 45, 90, 135, 180, 225, 270 and 315 degrees). Each of the output clock signals might be provided to a respective signal line for output to the multiplexer 582.

In response to the output clock signals of the clock divider 584, the multiplexer 582 might function as a data serializer to sequentially pass data from one of the inputs from the page buffer 240 for output to the signal driver 586. Examples of data serializers might be found with reference to U.S. patent application Ser. No. 16/205,755 to Pilolli et al., filed Nov. 30, 2018, which depicts multiplexers configured to function as data serializers, and constructed of a combination of logic gates, e.g., NAND gates and NOR gates.

The signal driver 586 might be configured to provide an output signal to the output buffer 588 representative of a data value of its input from the multiplexer 582. The output buffer 588 might be configured to provide an output signal to the I/O bus 134 representative of a data value of its input from the signal driver 586. The multiplexer 582, signal driver 586 and/or output buffer 588 might include one or more transistors having a control gate structure in accordance with an embodiment.

Figure 6B:
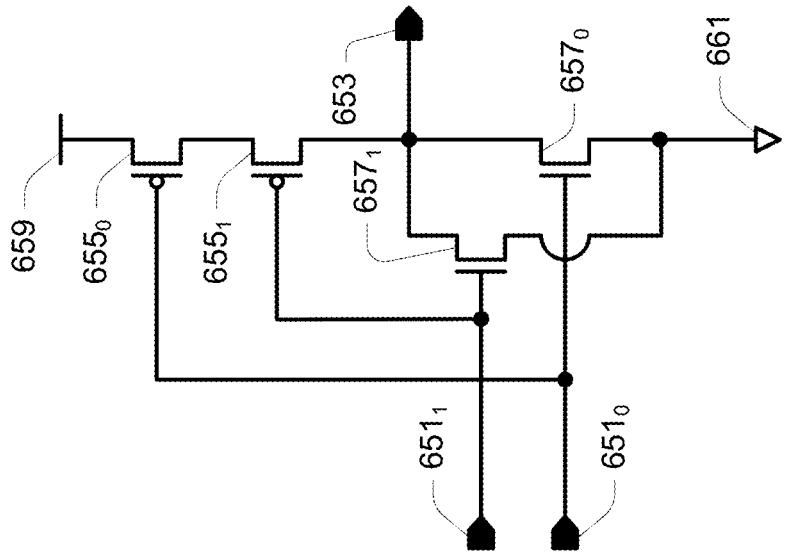
FIGS. 6A-6F are schematics of various circuit elements as might be found in a data path of an integrated circuit device that might include transistors having control gate structures in accordance with embodiments.
Figure 6A:
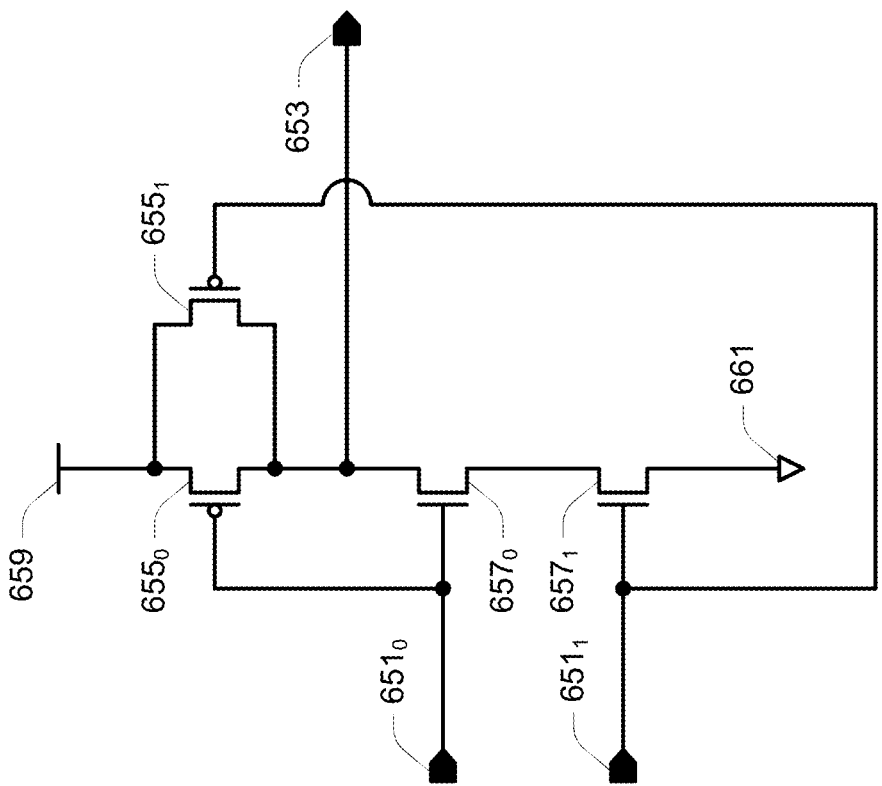

FIGS. 6A-6F are schematics of various circuit elements as might be found in a data path of an integrated circuit device that might include transistors having control gate structures in accordance with embodiments. As previously mentioned, a multiplexer configured to function as a data serializer might be formed of a combination of NAND gates and NOR gates. FIGS. 6A and 6B are schematics of a NAND gate and a NOR gate, respectively, that might include control gate structures in accordance with embodiments.

The NAND gate of FIG. 6A might have a first input $651_0$ and a second input $651_1$. The first input $651_0$ might be connected to a control gate of a first p-type field-effect transistor (pFET) $655_0$, and to a control gate of a first n-type field-effect transistor (nFET) $657_0$. The first pFET $655_0$ might have a first source/drain connected to a voltage node 659, which might be configured to receive a top-rail supply voltage, such as the supply voltage Vcc or Vccq. The first pFET $655_0$ might have a second source/drain connected to a first source/drain of the first nFET $657_0$, and connected to an output 653.

The second input $651_1$ might be connected to a control gate of a second pFET $655_1$, and to a control gate of a second nFET $657_1$. The second pFET $655_1$ might have a first source/drain connected to the voltage node 659. The second pFET $655_1$ might have a second source/drain connected to the second source/drain of the first pFET $655_0$, connected to the first source/drain of the first nFET $657_0$, and connected to the output 653. The second nFET $657_1$ might have a first source/drain connected to a second source drain of the first nFET $657_0$, and a second source/drain connected to a voltage node 661, which might be configured to receive a bottom-rail supply voltage, e.g., a reference potential, such as the supply voltage Vss or Vssq, which might be ground or 0V.

As can be seen in FIG. 6A, when both inputs $651_0$ and $651_1$ have logic high values, the output 653 might have a logic low value. Similarly, if either input $651_0$ or $651_1$ has a logic low value, the output 653 might have a logic high value. The NAND gate of FIG. 6A could be extended to have three or more inputs. For example, an additional input 651 could be added by connecting it to the control gate of an additional pFET 655 connected in parallel with the pFETs $655_0$ and $655_1$, and connecting it to the control gate of an additional nFET 657 connected in series with the nFETs $657_0$ and $657_1$. One or more of the pFETs 655 and/or one or more of the nFETs 657 of FIG. 6A might have a control gate structure in accordance with an embodiment.

The NOR gate of FIG. 6B might have a first input $651_0$ and a second input $651_1$. The first input $651_0$ might be connected to a control gate of a first pFET $655_0$, and to a control gate of a first nFET $657_0$. The first pFET $655_0$ might have a first source/drain connected to a voltage node 659, which might be configured to receive a top-rail supply voltage, such as the supply voltage Vcc or Vccq. The first pFET $655_0$ might have a second source/drain connected to a first source/drain of a second pFET $655_1$.

The second input $651_1$ might be connected to a control gate of the second pFET $655_1$, and to a control gate of a second nFET $657_1$. The second pFET $655_1$ might have a second source/drain connected to an output 653, connected to a first source/drain of the first nFET $657_0$, and connected to a first source/drain of the second nFET $657_1$. The first nFET $657_0$ might have a second source/drain connected to a voltage node 661, which might be configured to receive a bottom-rail supply voltage, e.g., a reference potential, such as the supply voltage Vss or Vssq, which might be ground or 0V. The second nFET $657_1$ might have a second source/drain connected to the voltage node 661.

As can be seen in FIG. 6B, when at least one input $651_0$ and $651_1$ has a logic high value, the output 653 might have a logic low value. Similarly, if neither input $651_0$ or $651_1$ has a logic high value, the output 653 might have a logic high value. The NOR gate of FIG. 6B could be extended to have three or more inputs. For example, an additional input 651 could be added by connecting it to the control gate of an additional pFET 655 connected in series with the pFETs $655_0$ and $655_1$, and connecting it to the control gate of an additional nFET 657 connected in parallel with the nFETs $657_0$ and $657_1$. One or more of the pFETs 655 and/or one or more of the nFETs 657 of FIG. 6B might have a control gate structure in accordance with an embodiment.

Figure 6C:
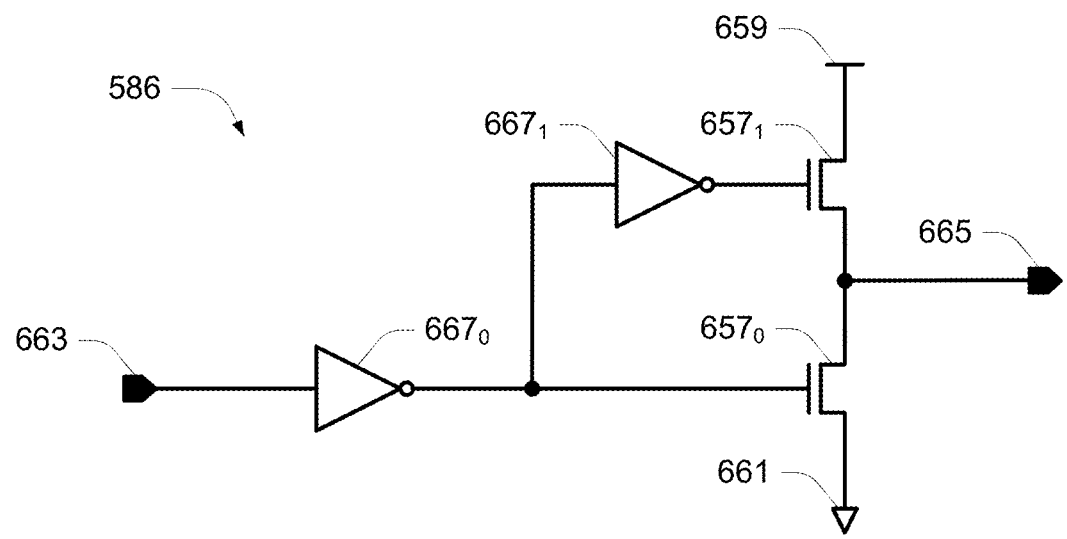

FIG. 6C is a schematic of an example of a signal driver 586 that might include control gate structures in accordance with embodiments. The signal driver 586 might have an input 663 connected to an input of a first inverter $667_0$. The first inverter $667_0$ might have an output connected to an input of a second inverter $667_1$, and connected to a control gate of a first nFET $657_0$. The second inverter $667_1$ might have an output connected to a control gate of a second nFET $657_1$.

The second nFET $657_1$ might have a first source/drain connected to a voltage node 659, which might be configured to receive a top-rail supply voltage, such as the supply voltage Vcc or Vccq. The second nFET $657_1$ might have a second source/drain connected to a first source/drain of the first nFET $657_0$, and connected to an output 665. The first nFET $657_0$ might have a second source/drain connected to a voltage node 661, which might be configured to receive a bottom-rail supply voltage, e.g., a reference potential, such as the supply voltage Vss or Vssq, which might be ground or 0V. As can be seen in FIG. 6C, when the input 663 has a logic high value, the output 665 might have a logic high value, and when the input 663 has a logic low value, the output 665 might have a logic low value. One or more of the nFETs 657 of FIG. 6C might have a control gate structure in accordance with an embodiment.

Figure 6D:
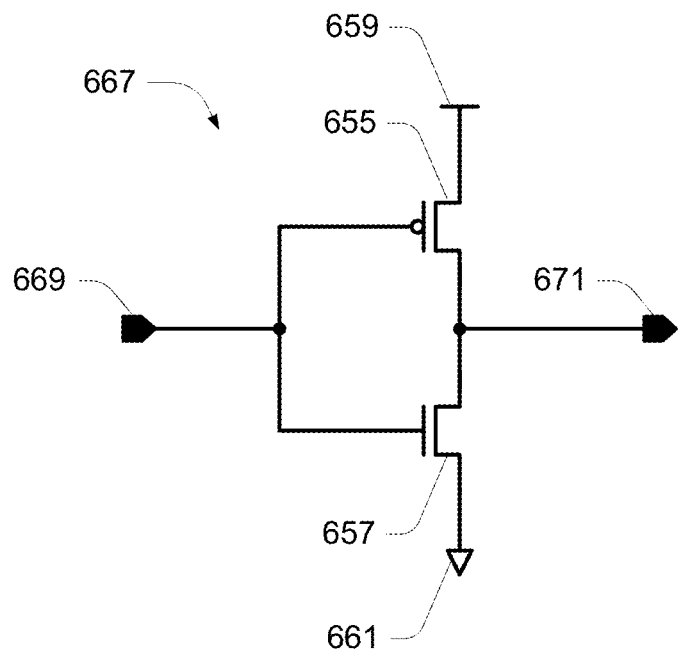

FIG. 6D is a schematic of an example of an inverter 667 that might include control gate structures in accordance with embodiments. The inverter 667 might have an input 669 connected to a control gate of a pFET 655, and connected to a control gate of an nFET 657. The pFET 655 might have a first source/drain connected to a voltage node 659, which might be configured to receive a top-rail supply voltage, such as the supply voltage Vcc or Vccq. The pFET 655 might have a second source/drain connected to a first source/drain of the nFET 657, and connected to an output 671. The nFET 657 might have a second source/drain connected to a voltage node 661, which might be configured to receive a bottom-rail supply voltage, e.g., a reference potential, such as the supply voltage Vss or Vssq, which might be ground or 0V. As can be seen in FIG. 6D, when the input 669 has a logic high value, the output 671 might have a logic low value, and when the input 669 has a logic low value, the output 671 might have a logic high value. The pFET 655 and/or the nFET 657 of FIG. 6D might have a control gate structure in accordance with an embodiment.

Figure 6E:
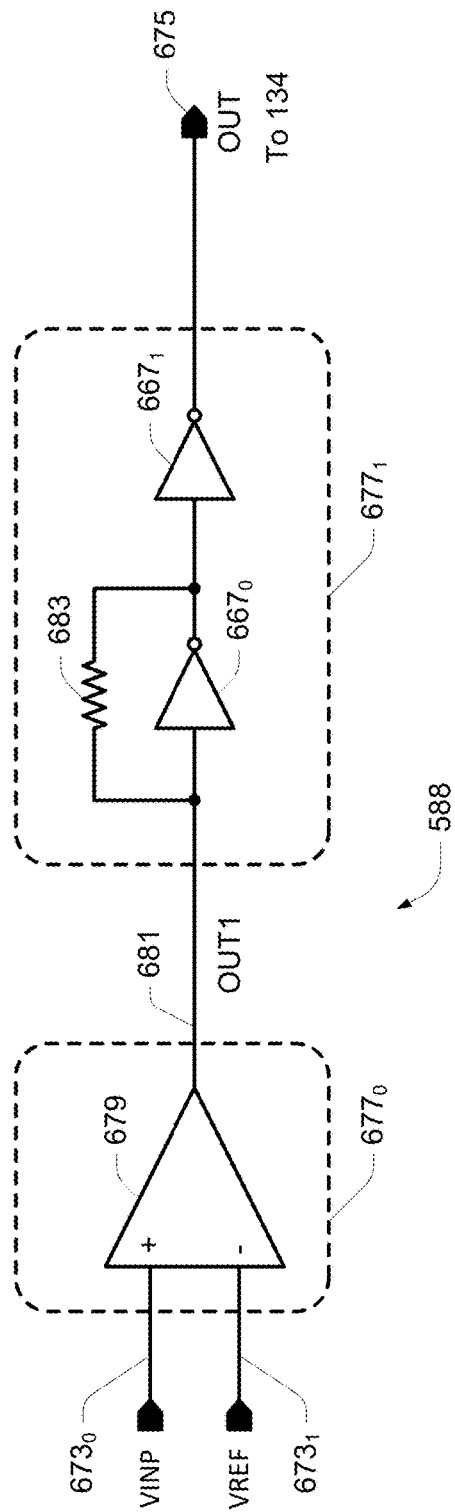

FIG. 6E is a schematic of an example of an output buffer 588 that might include control gate structures in accordance with embodiments. The output buffer 588 might have a first stage $677_0$ and a second stage $677_1$. The output buffer 588 might have a first input $673_0$ connected to a non-inverting input of a comparator 679 of the first stage $677_0$, and might have a second input $673_1$ connected to an inverting input of the comparator 679. The first input $673_0$ might be connected to the output 665 of the signal driver 586 of FIG. 6C to receive an input signal VINP, for example. The second input $673_1$ might be connected to receive a reference voltage VREF, which might be a voltage level halfway between the voltage levels of the voltage nodes 659 and 661. For example, where the voltage node 659 is configured to receive the supply voltage Vcc, and the voltage node 661 is configured to receive the supply voltage Vss as 0V, VREF might be equal to Vcc/2.

The comparator 679 might have an output 681 connected to an input of a first inverter $667_0$, and connected to a first terminal of a resistance (e.g., resistor) 683. The first inverter $667_0$ might have an output connected to an input of a second inverter $667_1$, and connected to a second terminal of the resistance 683. The second inverter $667_1$ might have an output connected to node 675, which might be configured to connect to a signal line of the I/O bus 134.

Figure 6F:
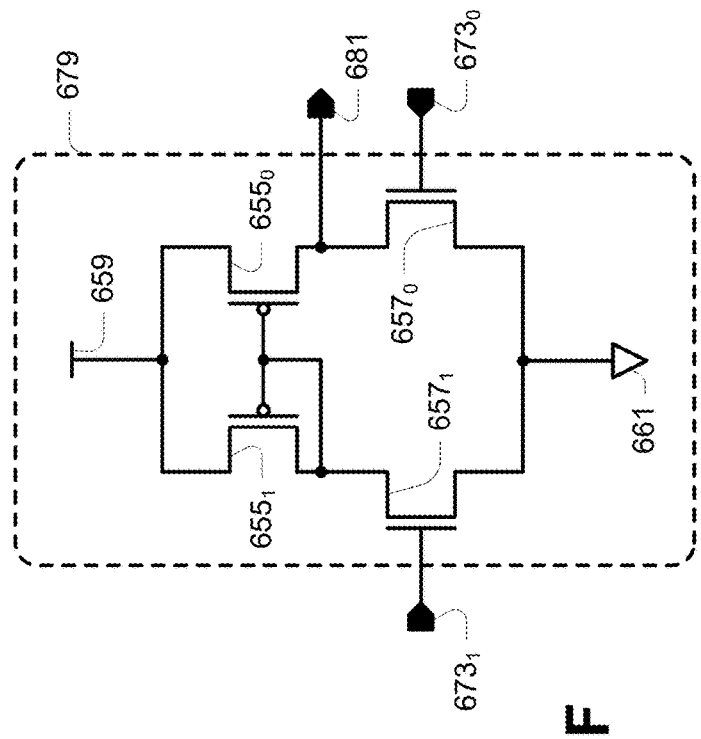

FIG. 6F is a schematic of an example of a comparator 679 that might include control gate structures in accordance with embodiments. The first input $673_0$ of the output buffer 588 might be connected to a control gate of a first nFET $657_0$, and the second input $673_1$ of the output buffer 588 might be connected to a second nFET $657_1$.

The first nFET $657_0$ might have a first source/drain connected to the output 681, and might have a second source/drain connected to a voltage node 661, which might be configured to receive a bottom-rail supply voltage, e.g., a reference potential, such as the supply voltage Vss or Vssq, which might be ground or 0V. The second nFET $657_1$ might have a first source/drain connected to a control gate of a first pFET $655_0$, and connected to a control gate of a second pFET $655_1$. The second nFET $657_1$ might further have a second source/drain connected to the voltage node 661.

The first pFET $655_0$ might have a first source/drain connected to a voltage node 659, which might be configured to receive a top-rail supply voltage, such as the supply voltage Vcc or Vccq. The first pFET $655_0$ might further have a second source/drain connected to the first source/drain of the first nFET $657_0$, and connected to the output 681. The second pFET $655_1$ might have a first source/drain connected to the voltage node 659, and a second source/drain connected to the first source/drain of the second nFET $657_1$. One or more of the pFETs 655 and/or one or more of the nFETs 657 of FIG. 6F might have a control gate structure in accordance with an embodiment.

CONCLUSION

Although specific embodiments have been illustrated and described herein, it will be appreciated by those of ordinary skill in the art that any arrangement that is calculated to achieve the same purpose might be substituted for the specific embodiments shown. Many adaptations of the embodiments will be apparent to those of ordinary skill in the art. Accordingly, this application is intended to cover any adaptations or variations of the embodiments.

What is claimed is:

1. A field-effect transistor, comprising:
   a gate dielectric overlying and immediately adjacent a semiconductor material; and
   a control gate overlying and immediately adjacent the gate dielectric, wherein the control gate comprises:
   an instance of a first polycrystalline silicon-containing material, wherein the first polycrystalline silicon-containing material consists essentially of polycrystalline silicon; and
   an instance of a second polycrystalline silicon-containing material, wherein the second polycrystalline silicon-containing material comprises a material selected from a group consisting of polycrystalline silicon-germanium and polycrystalline silicon-germanium-carbon.

2. The field-effect transistor of claim 1, wherein the instance of the second polycrystalline silicon-containing material is immediately adjacent the instance of the first polycrystalline silicon-containing material.

3. The field-effect transistor of claim 2, wherein the instance of the first polycrystalline silicon-containing material is immediately adjacent the gate dielectric.

4. The field-effect transistor of claim 3, wherein the instance of the first polycrystalline silicon-containing material is a first instance of the first polycrystalline silicon-containing material, and wherein the control gate further comprises:
   a second instance of the first polycrystalline silicon-containing material overlying the instance of the second polycrystalline silicon-containing material.

5. The field-effect transistor of claim 1, wherein the instance of the first polycrystalline silicon-containing material is a particular instance of one or more instances of the first polycrystalline silicon-containing material, wherein the instance of the second polycrystalline silicon-containing material is a particular instance of one or more instances of the second polycrystalline silicon-containing material, wherein the instances of the one or more instances of the first polycrystalline silicon-containing material are arranged in an alternating fashion with the instances of the one or more instances of the second polycrystalline silicon-containing material, and wherein a number of instances (S) of the one or more instances of the second polycrystalline silicon-containing material is a function of a number of instances (F) of the one or more instances of the first polycrystalline silicon-containing material satisfying the conditions:

$$(F-1) <= S <= (F+1), \text{ where } F >= 1 \text{ and } S >= 1.$$

6. The field-effect transistor of claim 1, wherein crystalline grains of the instance of the second polycrystalline silicon-containing material are represented by a chemical formula $Si_X Ge_Y C_Z$, where $X+Y+Z=1$, $0.05 <= Y <= 0.30$, and $0 <= Z <= 0.10$.

7. The field-effect transistor of claim 1, wherein the first polycrystalline silicon-containing material further contains less than 0.1 at % of any one element other than silicon, and less than 1 at % of all elements other than silicon.

8. A method of forming a field-effect transistor, comprising:
forming a dielectric overlying a semiconductor material; and
forming a control gate structure overlying the dielectric, wherein forming the control gate structure comprises:
forming a first instance of a first poly-silicon-containing material overlying the dielectric, wherein the first polycrystalline silicon-containing material consists essentially of polycrystalline silicon;
forming an instance of a second polycrystalline silicon-containing material overlying the first instance of the first polycrystalline silicon-containing material, wherein the second polycrystalline silicon-containing material consists essentially of a material selected from a group consisting of polycrystalline silicon-germanium and polycrystalline silicon-germanium-carbon; and
forming a second instance of the first polycrystalline silicon-containing material overlying the instance of the second polycrystalline silicon-containing material.

9. The method of claim 8, wherein forming the control gate structure overlying the dielectric comprises the control gate structure on the dielectric.

10. The method of claim 8, wherein forming the dielectric overlying the semiconductor material comprises forming a silicon oxide overlying a monocrystalline silicon semiconductor material.

11. The method of claim 10, wherein forming the silicon oxide overlying the monocrystalline silicon semiconductor material comprises forming a thermal oxide of the monocrystalline silicon.

12. The method of claim 8, wherein forming the first instance of the first poly-silicon-containing material overlying the dielectric comprises forming the first instance of the first poly-silicon-containing material immediately adjacent the dielectric.

13. The method of claim 8, wherein the instance of the second poly-silicon-containing material is a first instance of the second poly-silicon-containing material, and wherein forming the control gate structure further comprises forming a second instance of the second poly-silicon-containing material overlying the dielectric.

14. The method of claim 8, wherein the instance of the second poly-silicon-containing material is a first instance of the second poly-silicon-containing material, and wherein forming the control gate structure further comprises forming a second instance of the second poly-silicon-containing material overlying the second instance of the first poly-silicon-containing material.

15. The method of claim 8, wherein the method further comprises doping the control gate structure with a dopant impurity.

16. The method of claim 15, wherein the dopant impurity comprises boron.

17. A memory, comprising:
an array of memory cells;
a conductive node for connection to an external device; and
a data path between the array of memory cells and the conductive node, wherein the data path comprises a transistor;
wherein the transistor comprises:
a gate dielectric overlying a semiconductor; and
a control gate overlying and immediately adjacent the gate dielectric, wherein the control gate comprises:
a first instance of a first polycrystalline silicon-containing material;
an instance of a second polycrystalline silicon-containing material overlying the first instance of the first polycrystalline silicon-containing material; and
a second instance of the first polycrystalline silicon-containing material overlying the instance of the second polycrystalline silicon-containing material;
wherein the first polycrystalline silicon-containing material consists essentially of polycrystalline silicon and boron; and
wherein the second polycrystalline silicon-containing material consists essentially of a material selected from a group consisting of polycrystalline silicon-germanium and polycrystalline silicon-germanium-carbon, and boron.

18. The memory of claim 17, wherein the data path comprises at least one circuit element selected from a group consisting of a multiplexer comprising the transistor, a signal driver comprising the transistor, an output buffer comprising the transistor, an inverter comprising the transistor, a NAND gate comprising the transistor, and a NOR gate comprising the transistor.

19. The memory of claim 17, wherein the instance of the second polycrystalline silicon-containing material is a first instance of the second polycrystalline silicon-containing material, and wherein the control gate further comprises:
a second instance of the second polycrystalline silicon-containing material overlying the second instance of the first polycrystalline silicon-containing material.

20. The memory of claim 19, wherein a thickness of the second instance of the second polycrystalline silicon-containing material is greater than a thickness of the first instance of the second polycrystalline silicon-containing material.

21. The memory of claim 20, wherein the thickness of the first instance of the second polycrystalline silicon-containing material is less than a thickness of the second instance of the first polycrystalline silicon-containing material.

22. The memory of claim 17, wherein the first instance of the first polycrystalline silicon-containing material is overlying and immediately adjacent the gate dielectric.

23. The memory of claim 17, wherein the instance of the second polycrystalline silicon-containing material is a first instance of the second polycrystalline silicon-containing material, and wherein the control gate further comprises:
a second instance of the second polycrystalline silicon-containing material overlying the gate dielectric;
wherein the first instance of the first polycrystalline-silicon-containing material is overlying the second instance of the second polycrystalline silicon-containing material.

24. The memory of claim 17, wherein crystalline grains of the instance of the second polycrystalline silicon-containing material are represented by a chemical formula $Si_XGe_YC_Z$, where $X+Y+Z=1$, $0.05<=Y<=0.30$, and $0<=Z<=0.10$.

25. The memory of claim 17, wherein the control gate further comprises:
an instance of a third polycrystalline silicon-containing material overlying the second instance of the first polycrystalline silicon-containing material;
wherein the third polycrystalline silicon-containing material consists essentially of a material selected from a group consisting of polycrystalline silicon-germanium and polycrystalline silicon-germanium-carbon, and boron; and
wherein crystalline grains of the third polycrystalline silicon-containing material have a different chemical formula than crystalline grains of the second polycrystalline silicon-containing material.

* * * * *